(12) United States Patent
Min (10) Patent No.: US 6,275,075 B1
(45) Date of Patent: Aug. 14, 2001

(54) CURRENT COMPARATOR

(75) Inventor: Byung-Moo Min, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/459,462

(22) Filed: Dec. 13, 1999

(30) Foreign Application Priority Data

Dec. 15, 1998 (KR) .................................. 98-55099

(51) Int. Cl.[7] .............................. H03K 5/153; H03K 5/22
(52) U.S. Cl. ................................................. 327/77; 327/88
(58) Field of Search .................................. 327/52, 53, 54, 327/56, 60, 63, 66, 67, 69, 70, 72, 77–82, 88–90; 330/250, 252, 253, 255, 257, 260, 262, 265, 271, 277

(56) References Cited

U.S. PATENT DOCUMENTS

| | | | |
|---|---|---|---|
| 4,287,570 | * 9/1981 | Stark | 365/104 |
| 4,418,290 | * 11/1983 | Nagano | 330/252 |
| 4,464,591 | * 8/1984 | Rapp | 327/88 |
| 5,446,397 | 8/1995 | Yotsuyanagi | 327/66 |
| 5,477,170 | * 12/1995 | Yotsuyanagi | 327/66 |
| 5,627,494 | * 5/1997 | Somerville | 330/257 |
| 5,748,534 | * 5/1998 | Dunlap et al. | 365/185.21 |

* cited by examiner

Primary Examiner—My-Trang Nu Ton
(74) Attorney, Agent, or Firm—Fleshner & Kim, LLP (57) ABSTRACT

The present invention provides a current comparator that reduces both input and output resistance. The current comparator positions a resistive feedback network in a first inverting amplifier of an input stage. The input stage according to the present invention can include a first and a second input terminal, an output terminal, a reference current source, a load circuit, a driving unit, and a resistive circuit. The reference current source supplies a reference current to the first input terminal. The load circuit supplies a first current to the output terminal. The first current is preferably equal to the reference current. The driving unit generates a prescribed output voltage by controlling the first current based on an input current applied to the second input terminal. The resistor is coupled between a control terminal of the driving unit, the second input terminal and the output terminal.

23 Claims, 8 Drawing Sheets

CURRENT COMPARATOR

BACKGROUND OF THE INVENTION

1. Field of the Invention

The present invention relates to a comparator, and in particular to a comparator that generates a digital output signal in accordance with an input signal.

2. Background of the Related Art

Current-mode operations have been considered as an alternative in analog circuit designs with high speed and/or low power consumption VLSI technology. Comparators have been, and are still, an important building block in electronic systems including data o converters and other front-end signal processing applications.

Figure 1:
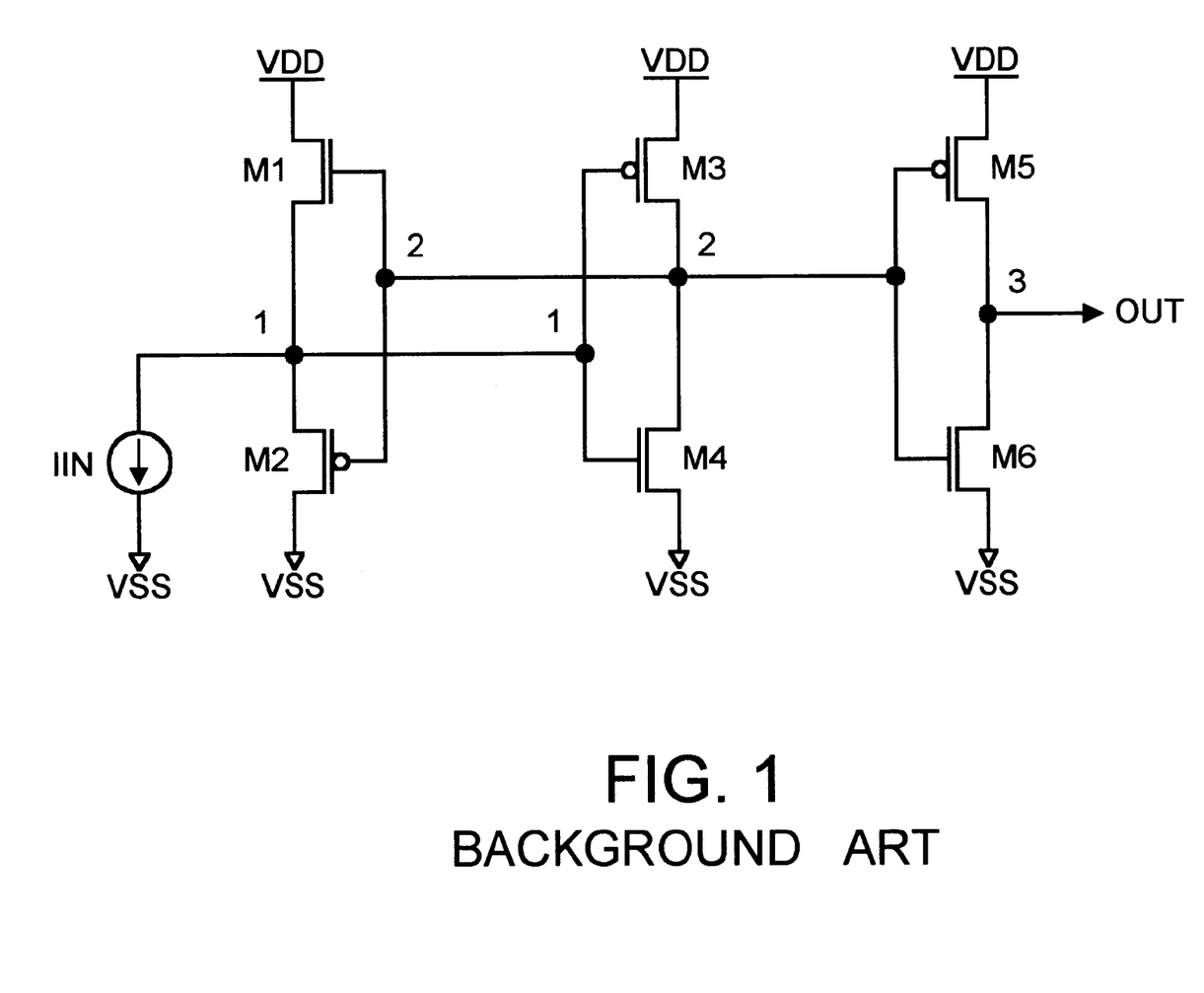
FIG. 1 is a circuit diagram that shows a related art current comparator.

FIG. 1 shows a circuit of a related art current comparator disclosed in Electronics Letters, Jan. 6, 1994 Vol. 30 No. 1. As shown in FIG. 1, MOS transistors M1 and M2 form a class B voltage buffer, and MOS transistors M3 to M6 form two inverting amplifiers. IIN is an input current, which is the difference between an input signal and reference currents. The inverting amplifiers have three modes of operation.

First, when the input current IIN is positive, voltage V1 at a node 1 pulled high level. This high level voltage V1 is inverted and amplified by a PMOS transistor M3 and an NMOS transistor M4, which causes voltage V2 at a node 2 to go low level. As gate-source voltage VGS1 of the NMOS transistor M1 and gate-source voltage VGS2 of the PMOS transistor M2 are negative, the NMOS transistor M1 is turned off and the PMOS transistor M2 is turned on. In this state, the node 1 is a low impedance node.

When the sign of input current IIN is changed (i.e., a direction of the current IIN is changed), there is insufficient gate drive for the buffer to supply input current IIN, because the NMOS transistor M1 and the PMOS transistor M2 of the buffer are not perfectly in on/off states, respectively. Thus, the node 1 is temporarily a high impedance node.

When the input current IIN is negative, the voltage V1 is pulled low level and the voltage V2 is pulled high level, turning the NMOS transistor M1 on and the PMOS transistor M2 off, the node 1 is low impedance again. The width of this deadband region in the transfer characteristics of the voltage buffer M1 and M2 is determined by the threshold voltage of M1 and M2, and a response time of the comparator increases, as the input current IIN decreases.

The current comparator in FIG. 1 reduced the deadband region by changing the biasing scheme of M1 and M2 from class B to class AB operation. The class AB operation results in smaller voltage swings at node 1 and node 2, and hence faster response times. However, the current comparator requires a complicated bias circuit of class AB to reduce the deadband region, which increases power consumption. Therefore, the current comparator uses nonlinear positive feedback to enhance the response time achieved at the expense of sensitivity and power consumption. The above references are incorporated by reference herein where appropriate for appropriate teachings of additional or alternative details, features and/or technical background.

SUMMARY OF THE INVENTION

An object of the present invention is to provide a current comparator that substantially obviates one or more of the problems caused by limitations and disadvantages of the related art.

Another object of the present invention is to provide a current comparator that reduces both input and output resistance by placing a resistive feedback network in a first inverting amplifier of an input stage.

Another object of the present invention is to provide a current comparator that generates a digital output signal according to an input signal.

Another object of the present invention is to provide a current comparator that generates a digital output signal according to a sign of an input current signal.

To achieve these and other objects and advantages in a whole or in parts and in accordance with the purpose of the present invention, as embodied and broadly described, a current comparator according to the present invention includes first and second input terminals, an output terminal, a reference current source that supplies a reference current to the first input terminal, a load circuit that supplies a first current to the output terminal, wherein the load circuit is coupled to the first input terminal and the first current is substantially equal to the reference current, a driving circuit that generates an output voltage by controlling the first current according to an input current applied to the second input terminal, and a resistor coupled between the driving circuit and the output terminal.

To further achieve the above objects in a whole or in parts, a current comparator according to the present invention includes a first inverting amplifier that includes first and second input terminals, an output terminal, a reference current source that supplies a reference current to the first input terminal, a load circuit that supplies a first current to the output terminal, wherein the load circuit is coupled to the first input terminal and the first current is substantially equal to the reference current, a driving circuit that generates an output voltage having a prescribed level by controlling the first current according to an input current applied to the second input terminal, and a resistor coupled between a control terminal of the driving circuit and the output terminal, and a second inverting amplifier that includes a pull-up transistor, and a pull-down transistor, wherein the pull-up transistor and the pull-down transistor are coupled in series between first and second prescribed voltages, and wherein the pull-up transistor is controlled by the reference current, wherein the pull-down transistor is controlled by the output voltage at the output terminal of the first inverting amplifier.

To further achieve the above objects in a whole or in parts, a comparator according to the present invention includes first and second input terminals, an output terminal, a reference current source that supplies a reference current to the first input terminal, an input current source that supplies an input current to the second input terminal, and a resistive circuit coupled between the first input terminal, the second input terminal and the output terminal that provides an output voltage to the output terminal according to the input current and the reference current.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2:
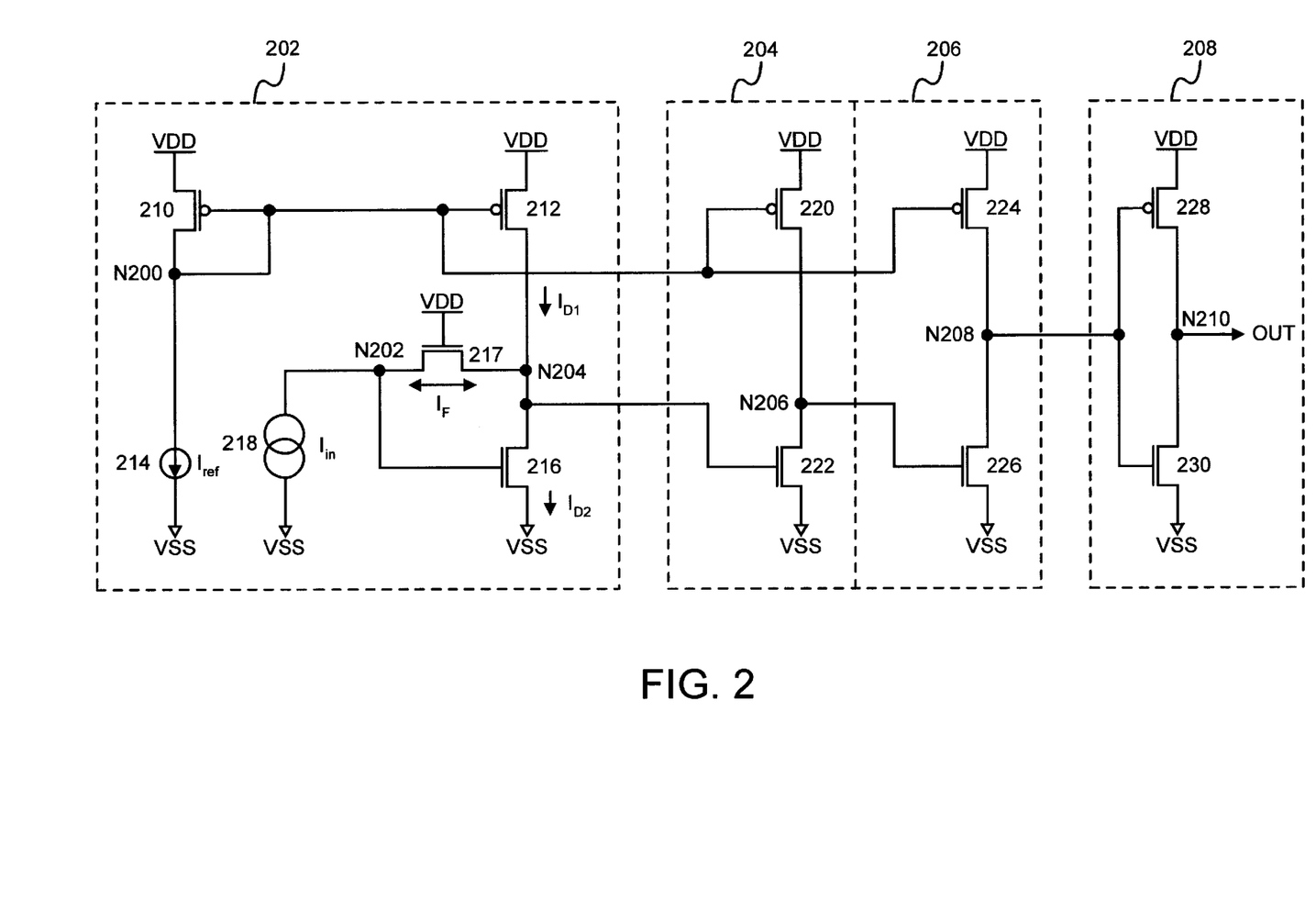
FIG. 2 is a circuit diagram that shows a preferred embodiment of a current comparator according to the present invention.

FIG. 2 is a circuit diagram that shows a preferred embodiment of a current comparator according to the present invention. As shown in FIG. 2, the preferred embodiment of a current comparator of the present invention includes three current-source inverting amplifiers 202, 204 and 206 and a CMOS inverter 208. The CMOS inverter 208 is preferably an output stage for generating a comparison result as a digitalized logic signal. The first inverting amplifier 202 includes a resistive feedback network.

The first inverting amplifier 202 includes two PMOS transistors 210 and 212 that form a current mirror load. A drain and a gate of the PMOS transistor 210 of the current mirror load supplies a node 200 with the reference current $I_{ref}$ from a current source 214. The PMOS transistor 212 of the current mirror load supplies an output node N204 with drain current $I_{D1}$ as much as reference current $I_{ref}$.

The output node N204 is formed by coupling a drain of the PMOS transistor 212 to a drain of an NMOS transistor 216, which is a driving transistor, that is turned on by a voltage level of an input node N202. The NMOS transistor 216 sinks current that is applied to the output node N204 to a ground VSS. The voltage level of the input node N202 depends on the value of an input current $I_{in}$.

Generally, voltage at the output node N204 is decided by a current difference between the drain current $I_{D1}$ of the PMOS transistor 212 and the drain current $I_{D2}$ of the NMOS transistor 216. In the first inverting amplifier 202 according to the preferred embodiment of the current comparator according to the present invention, the voltage at the output node N204 is also effected by feedback resistance of an NMOS transistor 217.

The second and the third inverting amplifier 204, 206 preferably operate to sufficiently amplify the output voltage V204 of the first inverting amplifier 202. The CMOS inverter 208 is coupled to an output of the third inverting amplifier 206 to transform a comparison result, which is produced by the first to third inverting amplifiers 202, 204 and 206, into a digitalized logic signal.

The second and the third inverting amplifiers 204 and 206 are preferably structured identical to each other. A PMOS transistor 220 as a pull-up circuit and an NMOS transistor 222 as a pull-down circuit are coupled in series between the supply voltage VDD and the ground VSS and form the second inverting amplifier 204. The third inverting amplifier 206 includes a PMOS transistor 224 as a pull-up transistor and an NMOS transistor 226 as a pull-down transistor, which are also coupled in series between the supply voltage VDD and the ground VSS.

The PMOS transistors 220 and 224 as pull-up transistors in the second and the third inverting amplifiers 204 and 206 are preferably controlled by the reference current $I_{ref}$ of the first inverting amplifier 202. Thus, the pull-up transistors of the first to third inverting amplifiers 202, 204 and 206 are controlled by the same reference current $I_{ref}$. The controlling reference current $I_{ref}$ causes DC bias points of the first to third inverting amplifiers 202, 206 and 206 to preferably be identical to one another. In other words, an offset in each inverting amplifier is minimized by matching the DC bias points of the first to third inverting amplifiers 202, 204 and 206. The DC bias point must be determined to make the second and the third inverting amplifiers 204 and 206 preferably operate in a saturation region because high fidelity amplification is required.

The CMOS inverter 208 includes a PMOS transistor 228 as a pull-up transistor and an NMOS transistor 230 as a pull-down transistor, which are coupled in series between the supply voltage VDD and the ground VSS. A small output signal V204 at the node N204 of the first inverting amplifier 202 is amplified by the second and the third inverting amplifiers 204 and 206, respectively. The output signal V204 is preferably sufficiently amplified so that the CMOS inverter 208 operates as an output stage that transforms the amplified signal into 'logic 1 (HIGH)' or 'logic 0 (LOW),' which is a binary digital signal.

Accordingly, the DC bias point is preferably determined to make the CMOS inverter 208 operate in linear region or cut-off region. When input current $I_{in}$ is greater o than the reference current $I_{ref}$, an output signal OUT of the CMOS inverter 208 becomes logic 1 (HIGH), and when the reference current $I_{ref}$ is greater than the input current $I_{in}$, the output signal OUT becomes logic 0 (LOW).

Figure 3:
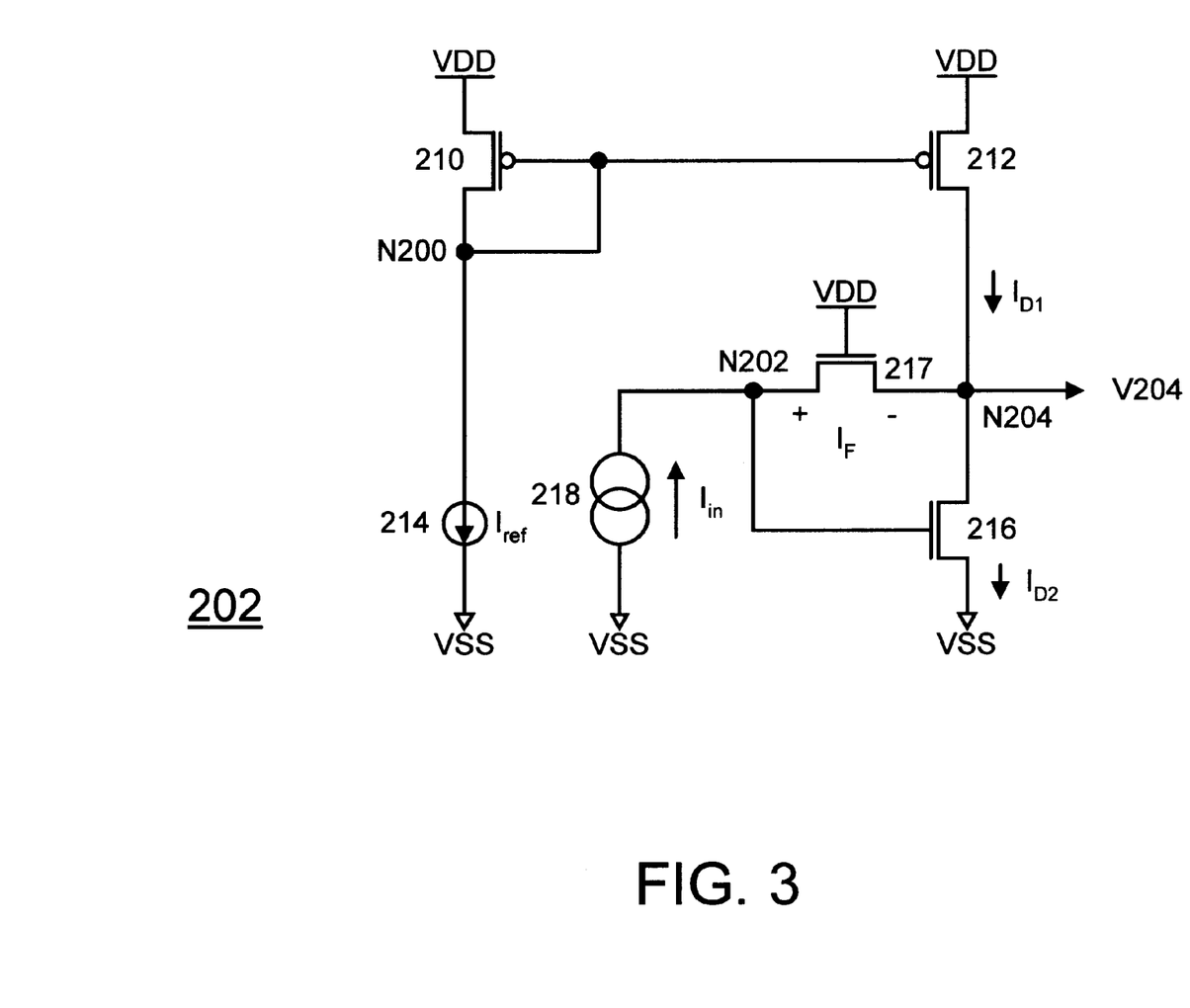
FIG. 3 is a circuit diagram that shows properties of the preferred embodiment of the current comparator according to the present invention in a first state.

FIG. 3 is a circuit diagram that shows feedback resistance in the preferred embodiment of a current comparator according to the present invention when the input current $I_{in}$ flows towards an input node N202. As shown in FIG. 3, voltage level of the output node N204 is lower than the input node N202 because of the source-drain voltage drop in an NMOS transistor 217. In this case, the voltage difference is proportional to a turn-on resistance of the NMOS transistor 217. As described above, the voltage level at the output node N204 is fixed to a prescribed value by the reference current $I_{ref}$. In this state, the voltage level at the output node N204 decreases because of the voltage drop caused by the NMOS transistor 217. In particular, the voltage level at the output node N204 rapidly decreases by the NMOS transistor 217 working as feedback resistance and by the current sinking caused by the NMOS transistor 216.

Figure 4:
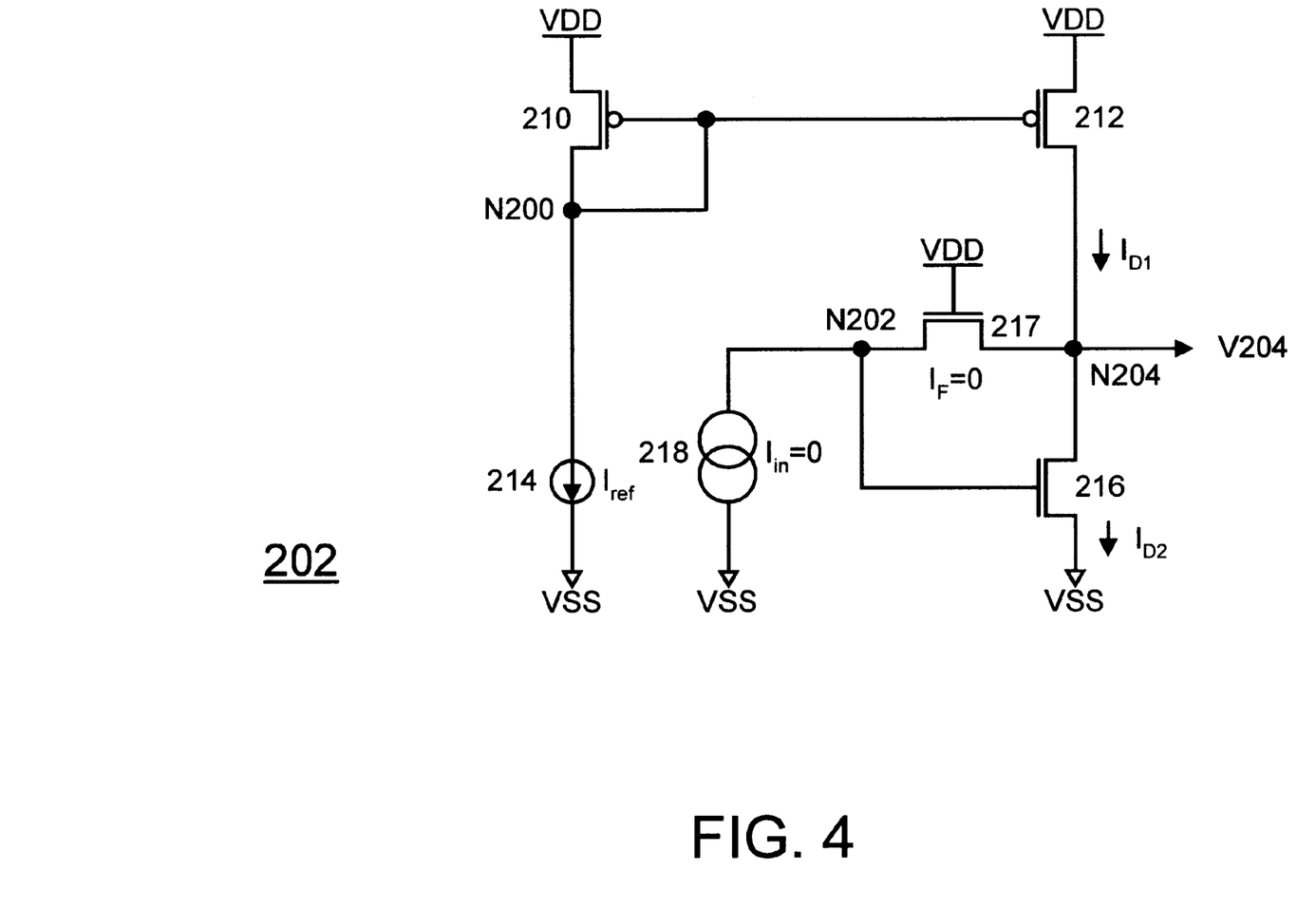
FIG. 4 is a circuit diagram that shows properties of the preferred embodiment of the current comparator according to the present invention in a second state.

FIG. 4 is a circuit diagram that shows feedback resistance properties in the first inverting amplifier of the preferred embodiment of a current comparator according to the present invention when no current flows at the input node N202. As shown in FIG. 4, there is no voltage drop between source and drain of the NMOS transistor 217 since no current flows at the input node N202. Thus, the voltage level at the output node N204 maintains the prescribed voltage level caused by the reference current $I_{ref}$.

Figure 5:
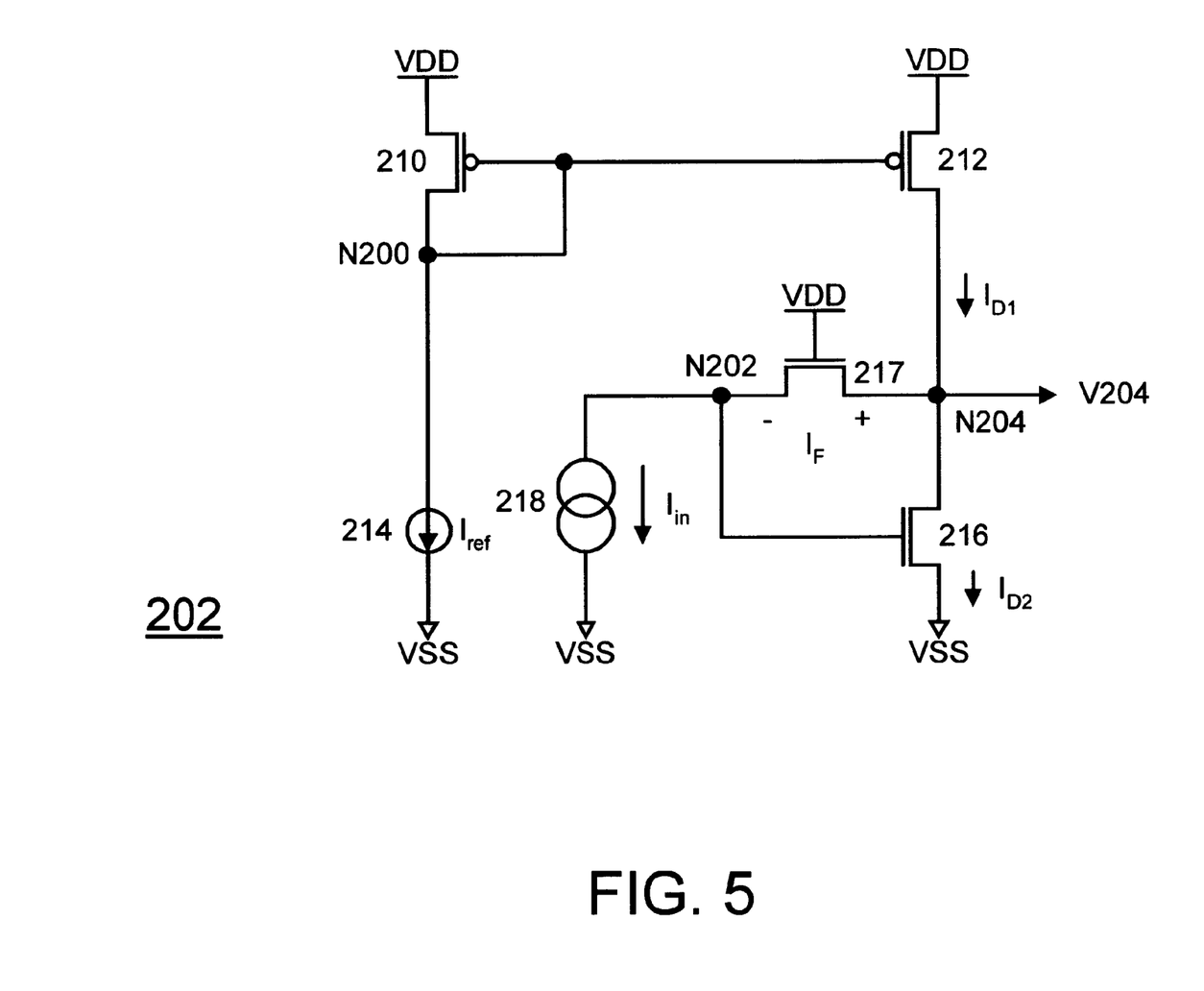
FIG. 5 is a circuit diagram that shows properties of the preferred embodiment of the current comparator according to the present invention in a third state.

FIG. 5 is a circuit diagram that shows feedback resistance in the first inverting amplifier of the preferred embodiment of a current comparator according to the present invention while the input current $I_{in}$ flows towards the ground VSS. As shown in FIG. 5, the voltage level at the input node N202 is somewhat lower than the output node N204 because of a source-drain voltage drop of an NMOS transistor 217. In this case, the voltage difference is also proportional to a turn-on resistance of the NMOS transistor 217. The voltage level at the output node N204 is fixed to the prescribed value by reference current $I_{ref}$. In this state, the voltage level at the output node N204 increases because of the voltage drop caused by the NMOS transistor 217. Namely, the voltage level at the output node N204 rapidly increases by the NMOS transistor 217 working as feedback resistance and by the current sourcing caused by PMOS transistor 212 of the current mirror load.

A small variation of voltage at the output node N204 in the first inverting amplifier 202 is preferably amplified greatly by the second and the third inverting amplifiers 204 and 206 shown in FIG. 2. That is because the second and the third inverting amplifiers 204 and 206 have the same DC bias point and are operated in the saturation region.

In a current comparator according to the preferred embodiment of the present invention, the trade-off should be properly made between speed and power consumption. The reference current $I_{ref}$ and the input impedance Rin according to the present invention are well controlled parameters. If the value of the reference current $I_{ref}$ varies, the speed improves by increasing (i.e., faster) as power consumption increases and the speed decreases (i.e., slower) as power consumption decreases.

A high speed current comparator needs very low input resistance for increased input current sinking and sourcing capabilities. So the preferred embodiment of the current comparator according to the present invention uses the resistive feedback network in the first inverting amplifier 202 to reduce the input and the output resistance. Using small-signal analysis, the input and output resistance of the current-source inverting amplifier 202 with a resistive feedback network can be given by equations (1) and (2) as follows.

$$R_\epsilon = \frac{R_{on} + \gamma_o}{1 + g_{m2}\gamma_o} \quad (1)$$

$$R_{out} = \frac{R_s + R_{on}}{1 + g_{m2}R_s + \frac{R_s + R_{on}}{\gamma_o}} \quad (2)$$

In the equations 1 and 2, $\gamma_o$ is an output resistance of an amplifier formed by the PMOS transistor 212 and the NMOS transistor 216 where $\gamma_o = 1/(g_{ds1} + g_{ds2})$. The $g_{ds1}$ and the $g_{ds2}$ are drain-source resistance of the PMOS transistor 212 and the NMOS transistor 216, respectively. $R_{on}$ is turn-on resistance of the NMOS transistor 217 operating in the linear region. $R_s$ is the output resistance of the input current source 218, and $g_{m2}$ is the transconductance of the NMOS transistor 216.

By neglecting $R_{on}$, which is very much smaller than $R_s$ or $\gamma_o$ ($R_{on} \ll R_s$, $R_o$), $R_{in} \approx 1/g_{m2}$ and $R_{out} \approx 1/g_{m2}$ are obtained. Thus, the input resistance Rin and the output resistance Rout of the first inverting amplifier 202 of FIG. 2 are approximately equal. The reduced resistance decreases the voltage swing between the input node N202 and the output node N204, and improves the transient response time of the inverting amplifier in the next stage, for example, the inverting amplifier 204.

Figure 6A:
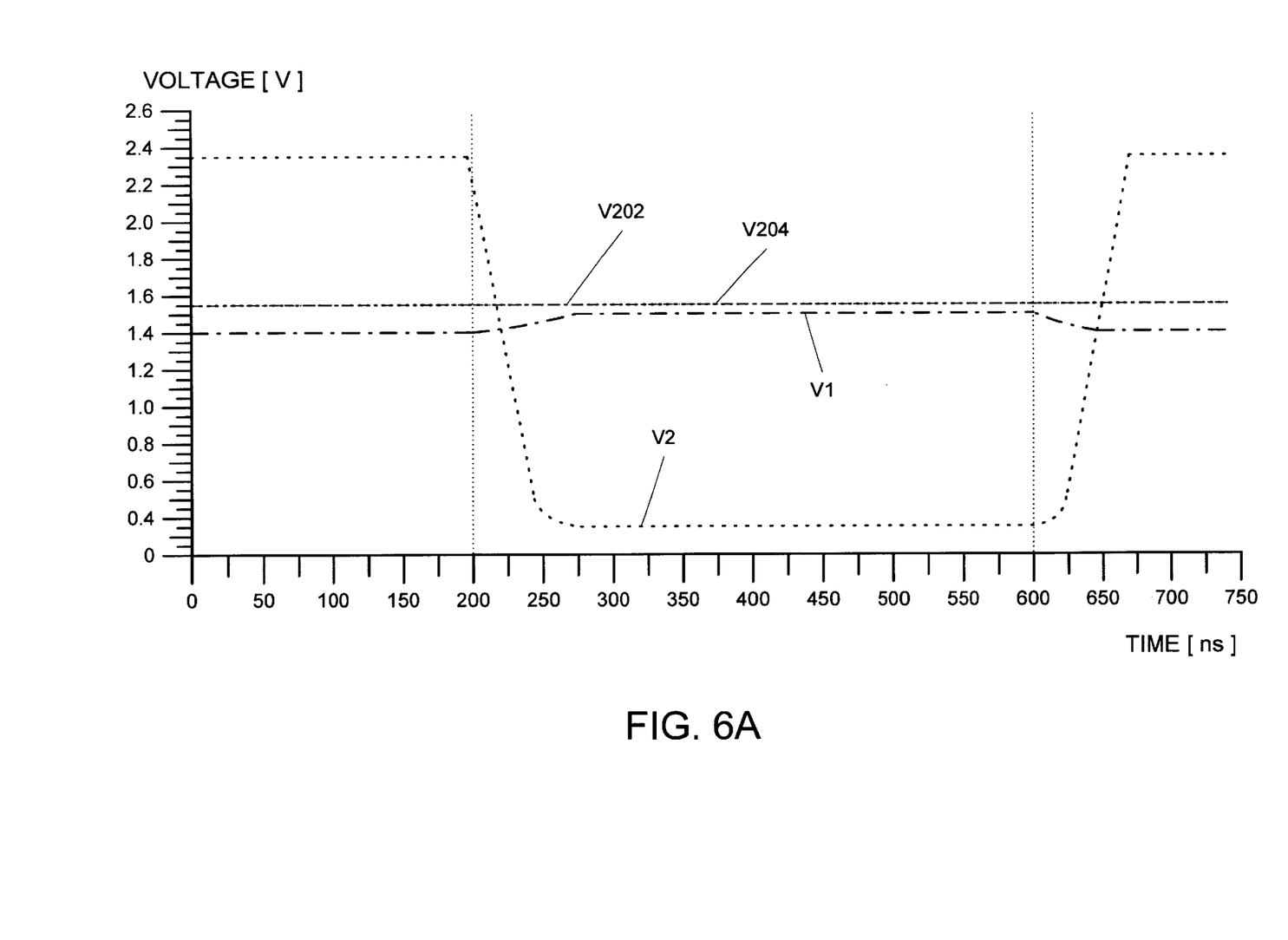
FIGS. 6A and 6B are diagrams that show exemplary circuit responses for a current comparator according to the preferred embodiment of the present invention.
Figure 6B:
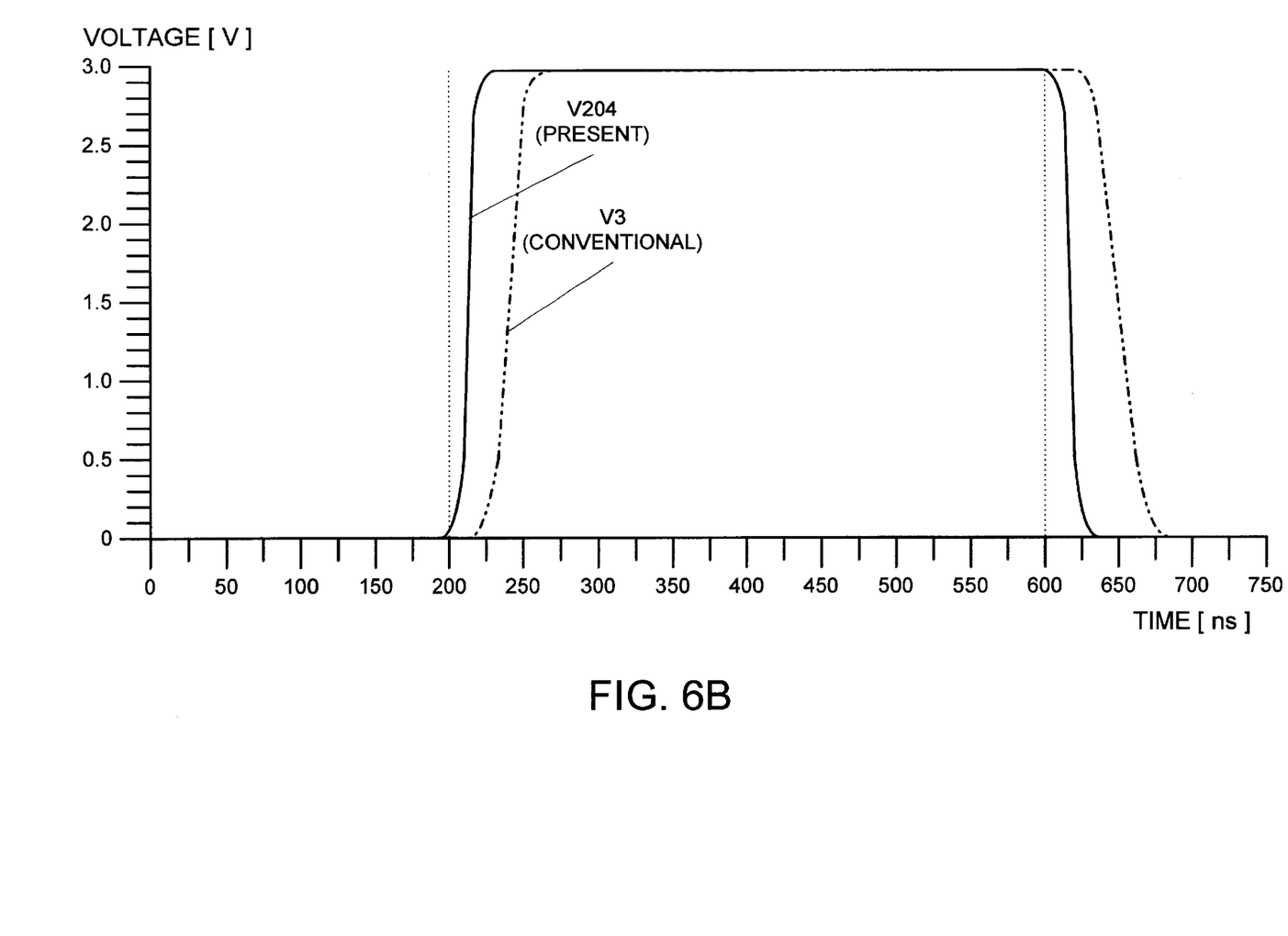

FIGS. 6A–6B are diagrams that show results of HSPICE simulation for a current comparator according to the preferred embodiment of the present invention with a simulation of the related art where an input is sinusoidal current of ±100 nA, supply voltage is 3V and reference current $I_{ref}$ is 50 µA. As shown in FIG. 6A, a swing width of voltage V2 at the node 2 according to variation of voltage V1 at the node 1 is very large in the related art. In contrast, according to the preferred embodiment of a current comparator, a swing width of voltage V202 at the input node N202 and the voltage V204 at the output node N204 are much smaller than those of the related art. The small swing widths of the voltage V202 at the input node N202 and the voltage V204 at the output node N204 cause a much shorter response time as shown in FIG. 6B. As shown in FIG. 6B, the output voltage V204 of the first inverting amplifier according to the preferred embodiment of current comparator rises much faster than the output voltage V3 of the related art.

Figure 7:
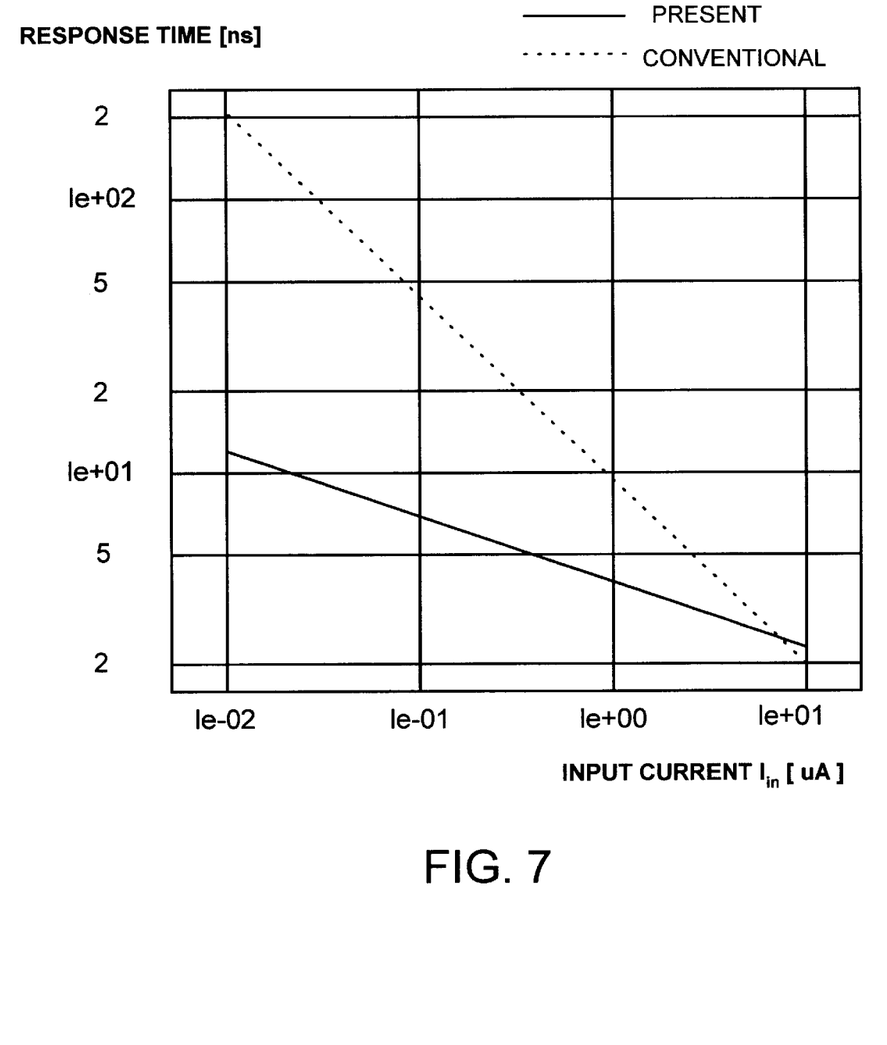
FIG. 7 is a diagram that shows a characteristic curve of response time according to input current in a preferred embodiment of a current comparator according to the present invention.

FIG. 7 is a diagram using log scales that shows a characteristic curve of response time according to input current in a current comparator according to the preferred embodiment. As shown in FIG. 7, the increased speed caused by the decrease of input current is improved over 100% under the current level of 10 µA. According to the preferred embodiment of the current comparator, it takes less than 2 ns until the input current reaches 10 µA. If the reference current $I_{ref}$ is increased, the speed is further improved or increased. This is because the increased output current of the first inverting amplifier 202 provides a very large current sufficient for the required transient response characteristics of the second and the third inverting amplifier 204 and 206 in the next stage.

As described above, a preferred embodiment of a current comparator according to the present invention has various advantages. Input and output resistance can each be reduced by the resistive feedback in the first inverting amplifier in the input stage of the preferred embodiment of a current comparator according to the present invention. Thus, an operating speed significantly or greatly increases as the capability of current sourcing and sinking increases. Moreover, the operating speed and the power consumption can be traded off each other or controlled properly by variation of the reference current when developing circuits based on circuit requirements.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A current comparator, comprising:

first and second input terminals;

an output terminal;

a reference current source that supplies a reference current to the first input terminal;

a load circuit that supplies a first current to the output terminal, wherein the load circuit is coupled to the first input terminal and the first current is substantially equal to the reference current;

a driving circuit that generates an output voltage by controlling the first current according to an input current applied to the second input terminal; and resistor means coupled between the driving circuit and the output terminal.

2. The current comparator of claim 1, wherein the value of the reference current is variable.

3. The current comparator of claim 1, wherein each control electrode of a first transistor and a second transistor in the load circuit is controlled by the reference current, and wherein the load circuit supplies the output terminal with the first current substantially equal to the reference current through a second electrode of the second transistor.

4. The current comparator of claim 1, wherein the resistor means is a first transistor with a control electrode coupled to receive a first prescribed voltage, the first transistor coupled between a second electrode of a second transistor in the load circuit and a control terminal of the driving circuit.

5. The current comparator of claim 4, wherein the first transistor is operated in a linear region.

6. The current comparator of claim 1, wherein the resistor means is a passive device coupled to the load circuit at the output node and a control terminal of the driving circuit.

7. The current comparator of claim 6, wherein the resistor means is a transistor having a control electrode coupled to a prescribed voltage, a first electrode coupled to an input current source and a second electrode coupled to the output terminal, and wherein the first electrode is also coupled to the control terminal of the driving circuit.

8. The current comparator of claim 1, wherein the load circuit comprises a first transistor and a second transistor having control electrodes coupled together and first electrodes coupled to a first prescribed voltage, wherein a second electrode of the first transistor is coupled to the control electrode of the second transistor and the first input terminal, wherein the second electrode of the second transistor is coupled to the output terminal, wherein the driving circuit comprises a third transistor having a first electrode coupled to a second prescribed voltage and a second electrode coupled to the output terminal, and wherein the resistor means comprises a fourth transistor having a control electrode coupled to a third prescribed voltage, a first electrode of the fourth transistor is coupled to a control electrode of the third transistor and the second input terminal, and a second electrode of the fourth transistor is coupled to the output terminal.

9. The current comparator of claim 8, wherein the reference current source is coupled between the second prescribed voltage and the first input terminal, and wherein an input current source is coupled between the second prescribed voltage source and the second input terminal, and wherein the first and third prescribed voltages are equal.

10. A current comparator, comprising:
a first inverting amplifier that comprises,
first and second input terminals,
an output terminal,
a reference current source that supplies a reference current to the first input terminal,
a load circuit that supplies a first current to the output terminal, wherein the load circuit is coupled to the first input terminal and the first current is substantially equal to the reference current,
a driving circuit that generates an output voltage having a prescribed level by controlling the first current according to an input current applied to the second input terminal, and
a circuit coupled between a control terminal of the driving circuit and the output terminal; and
a second inverting amplifier that comprises,
a pull-up transistor, and
a pull-down transistor, wherein the pull-up transistor and the pull-down transistor are coupled in series between first and second prescribed voltages, wherein the pull-up transistor is controlled by the reference current, and wherein the pull-down transistor is controlled by the output voltage at the output terminal of the first inverting amplifier.

11. The current comparator of claim 10, wherein the value of the reference current is variable, and wherein the circuit is a passive device coupled to the load circuit at the output node.

12. The current comparator of claim 10, wherein each control electrode of a first transistor and a second transistor in the load circuit is controlled by the reference current, wherein the load circuit supplies the output terminal with the first current substantially equal to the reference current through a second electrode of the second transistor, and wherein the circuit is a third transistor with a control electrode coupled to receive a first prescribed voltage, the third transistor coupled between a second electrode of the second transistor in the load circuit and the control terminal of the driving circuit.

13. The current comparator of claim 10, wherein at least two second inverting amplifiers are coupled in series to the output terminal of the first inverting amplifier.

14. The current comparator of claim 10, wherein the second inverting amplifier is biased to operate in a saturated region.

15. The current comparator of claim 10, further comprising a third inverting amplifier that comprises:
a second pull-up transistor, and
a second pull-down transistor, wherein the second pull-up transistor and the second pull-down transistor are coupled in series between the first and second prescribed voltages, wherein the second pull-up transistor is controlled by the reference current and the second pull-down transistor is controlled by an output signal of the second inverting amplifier, wherein the second inverting amplifier operates in a saturated region and the third inverting amplifier operates in one of the saturated region and a linear region.

16. The current comparator of claim 10, wherein the first inverting amplifier includes:
a first transistor and a second transistor having control electrodes coupled together and first electrodes coupled to a first prescribed voltage, wherein a second electrode of the first transistor is coupled to the control electrode of the second transistor and the first input terminal, and wherein the second electrode of the second transistor is coupled to the output terminal;
a third transistor having a first electrode coupled to a second prescribed voltage and a second electrode coupled to the output terminal;
a fourth transistor having a control electrode coupled to a third prescribed voltage, a first electrode of the fourth transistor is coupled to a control electrode of the third transistor and the second input terminal, and a second electrode of the fourth transistor is coupled to the output terminal, and wherein the reference current source is coupled between the second prescribed voltage and the first input terminal; and
an input current source coupled between the second prescribed voltage source and the second input terminal.

17. A comparator, comprising:
first and second input terminals;
an output terminal;
a reference current source that supplies a reference current to the first input terminal;

an input current source that supplies an input current to the second input terminal;

a resistive circuit coupled between the first input terminal, the second input terminal and the output terminal that provides an output voltage to the output terminal according to the input current and the reference current, and an inverting amplifier that comprises, a pull-up transistor, and a pull-down transistor, wherein the pull-up transistor and the pull-down transistor are coupled in series between first and second prescribed voltages, and wherein the pull-up transistor is controlled by the reference current, and wherein the pull-down transistor is controlled by the output voltage at the output terminal.

18. The comparator of claim 17, wherein the resistive circuit is a resistive feedback circuit that compares the input current and the reference current to output a prescribed voltage at the output terminal.

19. The comparator of claim 17, wherein the resistive circuit comprises:

a first transistor and a second transistor having control electrodes coupled together and first electrodes coupled to a first prescribed voltage, wherein a second electrode of the first transistor is coupled to the control electrode of the second transistor and the first input terminal, and wherein the second electrode of the second transistor is coupled to the output terminal;

a third transistor having a first electrode coupled to a second prescribed voltage and a second electrode coupled to the output terminal; and a fourth transistor having a control electrode coupled to a third prescribed voltage, a first electrode of the fourth transistor is coupled to a control electrode of the third transistor and the second input terminal, and a second electrode of the fourth transistor is coupled to the output terminal.

20. A current comparator, comprising:

first and second input terminals;

an output terminal;

a reference current source that supplies a reference current to the first input terminal;

a first transistor and a second transistor having control electrodes coupled together and first electrodes coupled to a first prescribed voltage, wherein a second electrode of the first transistor is coupled to the control electrode of the second transistor and the first input terminal, wherein the second electrode of the second transistor is coupled to the output terminal, wherein the second transistor supplies a first current to the output terminal, and wherein the first current is substantially equal to the reference current;

a third transistor having a first electrode coupled to a second prescribed voltage, a control electrode coupled to the second input terminal and a second electrode coupled to the output terminal, wherein the third transistor generates an output voltage by controlling the first current according to an input current applied to the second input terminal; and a fourth transistor having a control electrode coupled to an enabling voltage, a first electrode of the fourth transistor is coupled to a control electrode of the third transistor and the second input terminal, and a second electrode of the fourth transistor is coupled to the output terminal.

21. The comparator of claim 20, further comprising an inverting amplifier that comprises:

a pull-up transistor, and a pull-down transistor, wherein the pull-up transistor and the pull-down transistor are coupled in series between first and second prescribed voltages, and wherein the pull-up transistor is controlled by the reference current, and wherein the pull-down transistor is controlled by the output voltage at the output terminal.

22. The comparator of claim 21, wherein at least two second inverting amplifiers are coupled in series to the output terminal of the first inverting amplifier.

23. A current comparator, comprising:

first and second input terminals;

an output terminal;

a reference current source that supplies a reference current to the first input terminal;

a load circuit that supplies a first current to the output terminal, wherein the load circuit is coupled between the first input terminal and the output terminal;

a driving circuit coupled between the second input terminal and the output terminal that generates an output voltage by controlling the first current according to an input current applied to the second input terminal; and a first transistor coupled between the driving circuit and the output terminal, wherein the first transistor has a control electrode coupled to receive a first prescribed voltage, wherein the first transistor is coupled between an electrode of a transistor in the load circuit and a control terminal of the driving circuit.

* * * * *